(12) United States Patent
Guo et al.

(10) Patent No.: US 9,779,645 B2
(45) Date of Patent: Oct. 3, 2017

(54) DISPLAY PANEL, DISPLAY METHOD AND DISPLAY DEVICE

(71) Applicants: BOE TECHNOLOGY GROUP CO., LTD., Beijing (CN); BEIJING BOE OPTOELECTRONICS TECHNOLOGY CO., LTD., Beijing (CN)

(72) Inventors: Renwei Guo, Beijing (CN); Xue Dong, Beijing (CN); Peng Liu, Beijing (CN); Kai Yang, Beijing (CN)

(73) Assignees: BOE Technology Group Co., Ltd., Beijing (CN); Beijing BOE Optoelectronics Technology Co., Ltd., Beijing (CN)

( * ) Notice: Subject to any disclaimer, the term of this patent is extended or adjusted under 35 U.S.C. 154(b) by 50 days.

(21) Appl. No.: 14/769,923

(22) PCT Filed: Sep. 26, 2014

(86) PCT No.: PCT/CN2014/087586
§ 371 (c)(1),
(2) Date: Aug. 24, 2015

(87) PCT Pub. No.: WO2015/196607
PCT Pub. Date: Dec. 30, 2015

(65) Prior Publication Data
US 2016/0247433 A1    Aug. 25, 2016

(30) Foreign Application Priority Data
Jun. 26, 2014 (CN) .......................... 2014 1 0294186

(51) Int. Cl.
*G09G 3/20* (2006.01)
*G09G 3/3208* (2016.01)
*H01L 27/32* (2006.01)

(52) U.S. Cl.
CPC ............. *G09G 3/20* (2013.01); *G09G 3/2003* (2013.01); *G09G 3/2074* (2013.01);
(Continued)

(58) Field of Classification Search
CPC ......... G09G 3/3648; G09G 2300/0426; G09G 2320/028; G09G 2300/0452;
(Continued)

(56) References Cited

U.S. PATENT DOCUMENTS 5,311,337 A    5/1994  McCartney, Jr.
6,914,649 B2   7/2005  Liu
(Continued)

FOREIGN PATENT DOCUMENTS

CN    1637560 A      7/2005
CN    101009083 A    8/2007
(Continued)

OTHER PUBLICATIONS

Chinese Office Action in Chinese Application No. 201410294186.6, dated Oct. 10, 2015 with English translation.
(Continued)

*Primary Examiner* — Sanjiv D Patel
(74) *Attorney, Agent, or Firm* — Collard & Roe, P.C.

(57) ABSTRACT

A display panel, a display method and a display device are disclosed; the display panel comprises sub pixel units of red (R), green (G), blue (B) and one other color (X), wherein the sub pixel units are arranged into a sub pixel unit array, the sub pixel units in the sub pixel unit array are all in a cross shape, the cross shape being constructed with rectangles with an aspect ratio of 3:1 in transverse and longitudinal directions, and the cross shape having equal lengths in the transverse and longitudinal directions; and respective sub pixel units in the sub pixel unit array are interlaced with each other sequentially and arranged periodically. The display (Continued)

panel makes the pixel structure more compact and the pixel sharing property more obvious.

20 Claims, 7 Drawing Sheets

(52) U.S. Cl.
CPC ... *G09G 3/3208* (2013.01); *G09G 2300/0426* (2013.01); *G09G 2300/0452* (2013.01); *H01L 27/3213* (2013.01); *H01L 27/3218* (2013.01)

(58) Field of Classification Search
CPC .............. G09G 3/2003; G09G 3/3607; G09G 2300/0439; G09G 3/2074; G09G 2340/06; G09G 3/20; H01L 27/3218; H01L 27/3211; H01L 27/3213; G02F 2001/134345; G02F 1/133514; G02F 1/134309

See application file for complete search history.

(56) References Cited

U.S. PATENT DOCUMENTS

| | | | |
|---|---|---|---|
| 7,248,314 B2 | 7/2007 | Yun | |
| 7,505,053 B2* | 3/2009 | Brown Elliott ... | G02F 1/133514 345/694 |
| 8,081,835 B2 | 12/2011 | Brown Elliott et al. | |
| 8,373,727 B2 | 2/2013 | Furihata et al. | |
| 8,508,548 B2 | 8/2013 | Brown Elliott et al. | |
| 8,786,645 B2 | 7/2014 | Gu | |
| 9,257,081 B2 | 2/2016 | Nakayama et al. | |
| 2005/0068321 A1* | 3/2005 | Jiao ....................... | G06T 11/203 345/443 |
| 2005/0225563 A1* | 10/2005 | Brown Elliott .......... | G09G 5/02 345/604 |
| 2009/0115712 A1* | 5/2009 | Morimoto ......... | G02F 1/134363 345/87 |
| 2009/0244101 A1* | 10/2009 | Langendijk ....... | G02F 1/133514 345/690 |
| 2010/0283803 A1 | 11/2010 | Chou | |
| 2013/0010235 A1 | 1/2013 | Hirosawa et al. | |
| 2013/0343010 A1* | 12/2013 | Hwang ................... | G06F 3/041 361/748 |
| 2014/0098418 A1* | 4/2014 | Lin ..................... | G02B 27/2214 359/463 |
| 2015/0379916 A1 | 12/2015 | Guo et al. | |
| 2016/0005382 A1 | 1/2016 | Guo et al. | |
| 2016/0027362 A1 | 1/2016 | Guo et al. | |
| 2016/0027369 A1 | 1/2016 | Guo et al. | |

FOREIGN PATENT DOCUMENTS

| | | |
|---|---|---|
| CN | 101076844 A | 11/2007 |
| CN | 101176108 A | 5/2008 |
| CN | 101211518 A | 7/2008 |
| CN | 101303842 A | 11/2008 |
| CN | 101393366 A | 3/2009 |
| CN | 101719037 A | 6/2010 |
| CN | 101937155 A | 1/2011 |
| CN | 102073175 A | 5/2011 |
| CN | 202285072 U | 6/2012 |
| CN | 102903318 A | 1/2013 |
| CN | 103163683 A | 6/2013 |
| CN | 103278960 A | 9/2013 |
| CN | 103529572 A | 1/2014 |
| CN | 103777393 A | 5/2014 |
| CN | 103778882 A | 5/2014 |
| CN | 103824520 A | 5/2014 |
| CN | 103886808 A | 6/2014 |
| CN | 104036701 A | 9/2014 |
| CN | 203931380 U | 11/2014 |
| CN | 204029329 U | 12/2014 |
| JP | 2012-133011 A | 7/2012 |
| KR | 10-1005903 B1 | 1/2011 |
| WO | 2008/131027 A1 | 10/2008 |
| WO | 2010/140767 A2 | 12/2010 |

OTHER PUBLICATIONS

Notification to Grant the Patent Right (Notice of Allowance) in Chinese Application No. 201410294186.6 dated Jan. 26, 2016 with English translation.
Issued Patent for Chinese Application No. 201410294186.6 (CN 104036701 B) granted on Mar. 2, 2016 in Chinese with an English translation of the Chinese granted claims.
International Search Report of PCT/CN2014/087586 in Chinese, dated Apr. 8, 2015 with English translation.
Notice of Transmittal of the International Search Report of PCT/CN2014/087586 in Chinese, dated Apr. 8, 2015.
Written Opinion of the International Searching Authority of PCT/CN2014/087586 in Chinese, dated Apr. 8, 2015 with English translation.
International Search Report and Written Opinion of the International Searching Authority of PCT/CN2015/088084 dated Apr. 15, 2015 in Chinese with English translation.
First Chinese Office Action in Chinese application No. 201410317831.1, dated Jan. 21, 2016 in Chinese with English translation.
Second Chinese Office Action in Chinese application No. 201410317831.1, dated Jun. 28, 2016 in Chinese with English translation.
Third Chinese Office Action in Chinese application No. 201410317831.1, dated Sep. 14, 2016 in Chinese with English translation.
International Search Report and Written Opinion of the International Searching Authority of PCT/CN2014/085477 dated Nov. 25, 2014 in Chinese with English translation.

* cited by examiner

DISPLAY PANEL, DISPLAY METHOD AND DISPLAY DEVICE

CROSS REFERENCE TO RELATED APPLICATIONS

This application is the National Stage of PCT/CN2014/087586 filed on Sep. 26, 2014, which claims priority under 35 U.S.C. §119 of Chinese Application No. 201410294186.6 filed on Jun. 26, 2014, the disclosure of which is incorporated by reference.

TECHNICAL FIELD

At least one embodiment of the invention relates to a display panel, a display method and a display device.

BACKGROUND

At present, a common pixel design for a display screen is RGB (red, green and blue) design or RGBW (red, green, blue and white) design, i.e., three or four sub pixels form one pixel for display, and a physical resolution of a display panel is an actual resolution felt by a user. With increased requirements of a user on experience of the display panel, a panel manufacturer gradually increases the resolution of the display panel, which results in a challenge to extremity for the display panel from structure to manufacturing process. When the process reaches its limit, other technologies or structures are required to increase the resolution felt by human eyes. Under such background, a virtual algorithm technology occurs in a display panel industry.

A virtual algorithm technology is widely used in the current display field, and through pixel sharing, a vision resolution higher than the physical resolution of the display panel can be implemented. At present, Samsung in South Korea is a panel manufacturer using the virtual algorithm technology at most. Since the process of forming a resin pattern of organics is very difficult to implement when Organic Light Emitting Diode (OLED) is used as the sub pixel, a bottleneck occurs in the manufacturing process of the display screen with higher resolution. Such a problem can be well solved by the virtual technology, improving the screen resolution felt by human eyes. This virtual technology is named as pentile technology, which is applied on high-end products, such as Samsung S3 and S4. For example, FIG. 1 is a pattern arrangement manner in Samsung S4.

SUMMARY OF THE INVENTION

At least one embodiment of the invention provides a display panel, a display method device and a display device, to implement a display panel and a display method having more compact pixel structure and more obvious pixel sharing property.

At least one embodiment of the invention provides a display panel, comprising sub pixel units of red (R), green (G), blue (B) and one other color (X), wherein the sub pixel units are arranged into a sub pixel unit array; the sub pixel units in the sub pixel unit array are all in a cross shape, the cross shape being constructed with rectangles with an aspect ratio of 3:1 in transverse and longitudinal directions, and the cross shape having equal lengths in the transverse and longitudinal directions; and the respective sub pixel units in the sub pixel unit array are sequentially and periodically interlaced with each other.

At least one embodiment of the invention further provides a display device, comprising the above-mentioned display panel.

At least one embodiment of the invention further provides a display method of a display panel, comprising: forming sub pixel units of red (R), green (G), blue (B) and other color (X), wherein the sub pixel units are arranged into a sub pixel unit array. The sub pixel units in the sub pixel unit array are all in a cross shape, the cross shape is constructed with rectangles with an aspect ratio of 3:1 in transverse and longitudinal directions, and the cross shape has equal lengths in the transverse and longitudinal directions; and respective sub pixel units in the sub pixel unit array are interlaced with each other sequentially and arranged periodically.

BRIEF DESCRIPTION OF THE DRAWINGS

In order to clearly illustrate the technical solution of the embodiments of the invention, the drawings of the embodiments will be briefly described in the following; it is obvious that the drawings in the description are only related to some embodiments of the invention and thus are not limitative of the invention.

DESCRIPTION OF THE EMBODIMENTS

In order to make purposes, technical details and advantages of the embodiments of the invention more apparent, the technical solutions of the embodiment will be described in a clearly and fully understandable way in connection with the drawings related to the embodiments of the invention. It is obvious that the described embodiments are just a part but not all of the embodiments of the invention. Based on the described embodiments herein, those skilled in the art can obtain other embodiment(s), which fall within the scope of the invention, without any inventive work.

Figure 1:
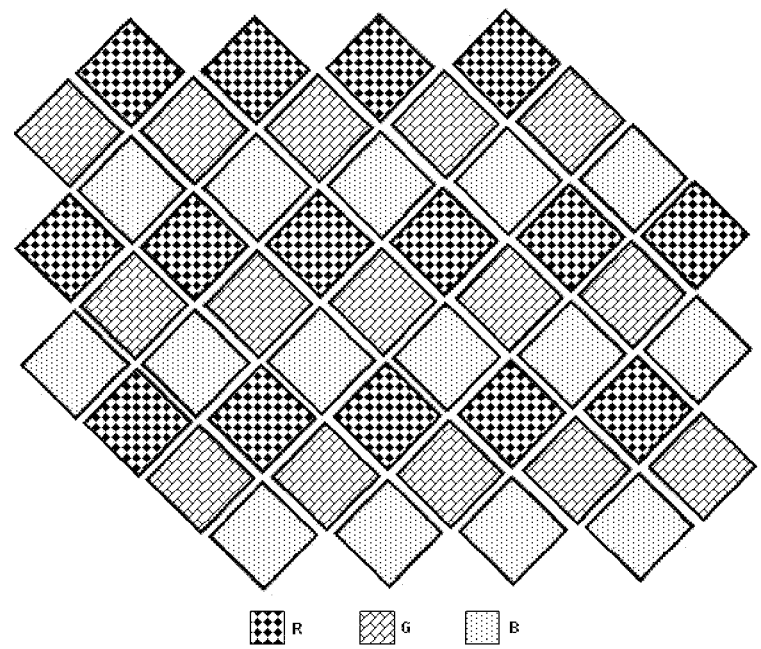
FIG. 1 is a schematic diagram of a sub pixel unit array of a display panel adopting a virtual display technology.

The inventors of the present application notices that an arrangement of a display panel adopting a pixel structure as shown in FIG. 1 is relatively loose, which results in a smaller brightness output area, such that display effect at the periphery of the display panel is unsatisfactory. Therefore, there is an urgent need for a display panel and a display method having more compact pixel structure and more obvious pixel sharing property.

A core concept of present disclosure is that, for each sub pixel unit, its color output surface is regarded as different planes. Differentiating from a case that sub pixel units in the display panel are in a square or rectangular shape, as shown in FIG. 1, the sub pixel units in the embodiments of the invention are in a cross shape. When the cross-shaped sub pixel units in the embodiments of the invention are used for pattern arrangement, multiple arrangement manners can be adopted; and when region dividing is performed within the plane, the pattern can be divided into multiple shapes. In the embodiments of the invention, division of a sampling region for each color can be determined by column (R) and row (L) positions.

Figure 2:
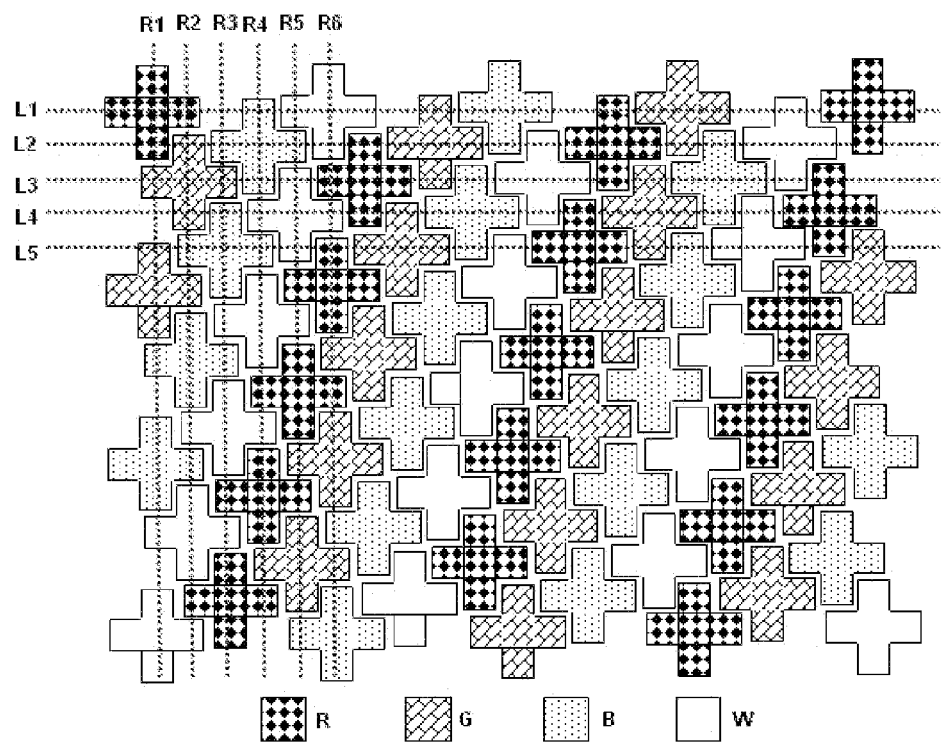
FIG. 2 is a schematic diagram of a sub pixel unit array of a display panel according to one embodiment of the invention.
Figure 3:
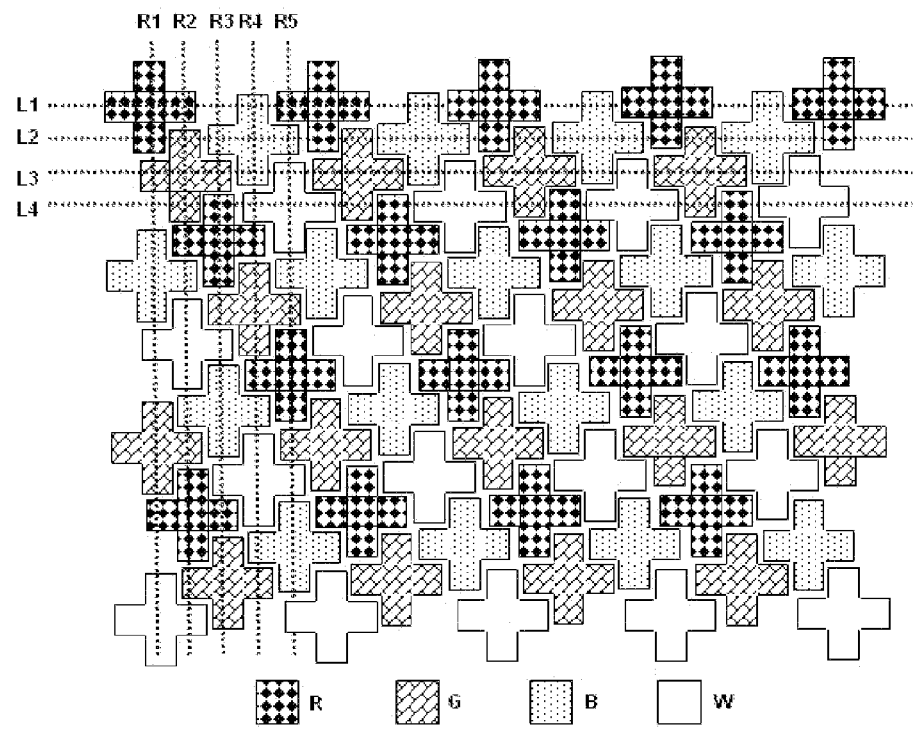
FIG. 3 is a schematic diagram of a sub pixel unit array of a display panel according to another embodiment of the invention.

A display panel provided by at least one embodiment of the invention comprises sub pixel units of red (R), green (G), blue (B) and other color (X), the sub pixel units being arranged into a sub pixel unit array; the sub pixel units in the sub pixel unit array are all in a cross shape. Referring to FIG. 2 or FIG. 3, three colors of red (R), green (G) and blue (B) are illustrated with a cross shape, the cross shape respectively consists of rectangles with an aspect ratio of 3:1 in transverse and longitudinal directions, and meanwhile the cross shape has equal lengths in the transverse and longitudinal directions; and respective sub pixel units in the sub pixel unit array are interlaced with each other sequentially and arranged periodically. In one embodiment, when brightness needs to be increased, white (W) sub pixel units can be increased, and sub pixel units of other colors such as yellow (Y) and cyan (C) can also be increased as required. In other words, the other colors (X) are white (W), yellow (Y) or cyan (C).

For example, respective sub pixel units in the sub pixel unit array are interlaced with each other sequentially and arranged periodically. The mutual positional relationship of the sub pixel units can be defined in such a manner as:

A horizontal axis and a vertical axis are set in one plane, abscissa x=R(1), R(2), R(3) . . . R(m), which are arranged from left to right in sequence, and a distance between adjacent abscissas is d; ordinate y=L(1), L(2), L(3) . . . L(n), which are arranged from top to bottom in sequence, and a distance between adjacent ordinates is d. In other words, the distance between adjacent abscissas is equal to that between adjacent ordinates. The abscissas and the ordinates respectively represent abscissas and ordinates of central positions of the respective sub pixel units. Positions of the sub pixel units in the plane are respectively: for Row $L(5*i_1+1)$, respective sub pixel units center at positions with abscissas being $R(5k_1+1)$, where $k_1$ and $i_1$ are integers and are greater than or equal to 0; for Row $L(5*i_1+2)$, respective sub pixel units center at positions with abscissas being $R(5k_1+4)$, where $k_2$ and $i_2$ are integers and are greater than or equal to 0; for Row $L(5*i_1+3)$, respective sub pixel units center at positions with abscissas being $R(5k_1+2)$, where $k_3$ and $i_3$ are integers and are greater than or equal to 0; for Row $L(5*i_1+4)$, respective sub pixel units center at positions with abscissas being $R(5k_1+5)$, where $k_4$ and $i_4$ are integers and are greater than or equal to 0; and for Row $L(5*i_1+5)$, respective sub pixel units center at positions with abscissas being $R(5k_1+3)$, where $k_5$ and $i_5$ are integers and are greater than or equal to 0.

Taking FIG. 2 or FIG. 3 as an example, centers of sub pixel units in a first row L1 are respectively located at positions of R1, R6, R11, R16 and the like, centers of sub pixel units in a second row L2 are respectively located at positions of R4, R9, R14, R19 and the like, centers of sub pixel units in a third row L3 are respectively located at positions of R2, R7, R12, R17 and the like, centers of sub pixel units in a fourth row L4 are respectively located at positions of R5, R10, R15, R20 and the like, centers of sub pixel units in a fifth row L5 are respectively located at positions of R3, R8, R13, R18 and the like, and center positions of sub pixel units in a sixth row L6 are same as the center positions of the sub pixel units in the first row L1 and are respectively located at positions of R1, R6, R11, R16 and the like, and so on.

In one embodiment of the invention, an arrangement manner of the sub pixel units of the first row y=L(1) is arranging from left to right sequentially according to a periodical cycle of RXBGRXBG, an arrangement manner of the sub pixel units of the second row y=L(2) is arranging from left to right sequentially according to a periodical cycle of BGRXBGRX, an arrangement manner of the sub pixel units of the third row y=L(3) is arranging from left to right sequentially according to a periodical cycle of GRXBGRXB, an arrangement manner of the sub pixel units of the fourth row y=L(4) is arranging from left to right sequentially according to a periodical cycle of XBGRXBGR, an arrangement manner of the sub pixel units of the fifth row y=L(5) is arranging from left to right sequentially according to a periodical cycle of BGRXBGRX. And the arrangement rule of other rows is that, if a sequence of Row L(i) is ABCDABCD, an arrangement sequence of Row L(i+5) is DABCDABC in sequence, where i is a natural number, and ABCD is one of RXBG, BGRX, GRXB and XBGR.

Taking four pixels of RGBW as an example, when those pixels are arranged, they are arranged according to the manner as shown in FIG. 2, the first row L1 being arranged according to RWBGRWBG; the second row L2 being arranged according to BGRWBGRW; the third row L3 being arranged according to GRWBGRWB; the fourth row L4 being arranged according to WBGRWBGR; the fifth row L5 being arranged according to BGRWBGRW. The arrangement rule of the other rows is that, if a sequence of Row L(i) is ABCDABCD, an arrangement sequence of Row L(i+5) is DABCDABC in sequence, where i is a natural number, and ABCD is one of RWBG, BGRW, GRWB and WBGR. As shown in FIG. 2, a first column R1 is arranged according to RGBWRGBW, a second column R2 is arranged according to GBWRGBWR, a third column R3 is arranged according to BWRGBWRG, and subsequent arrangements are as shown in FIG. 2.

It is assumed that a row pitch and a column pitch of the sub pixel units are both L (that is, d=L), a center pitch of the sub pixel units in a same row is 5L, so as to ensure that parts of the sub pixel units of two other colors can be placed between two adjacent sub pixel units in the same row. The center pitch of the sub pixel units in a same column is 5L, so that parts of sub pixel units of two adjacent color types for the sub pixel units can be alternately placed between two adjacent sub pixel units in the same column. For example, in row L3, two adjacent sub pixel units centering at coordinates (R2,L3) and (R7,L3) represent red and green respectively, with a center pitch of 5L. A part of a blue sub pixel unit with a center being at (R4,L2) and a part of a white sub pixel unit with a center being at (R5,L4) are placed between these two adjacent sub pixel units. In column R4, two adjacent sub pixel units centering at coordinates (R4,L2) and (R4,L7) represent blue and white respectively, with a center pitch of 5L. A part of a white sub pixel unit with a center being at (R5,L4) and a part of a blue sub pixel unit with a center being at (R3,L5) are placed between these two adjacent sub pixel units.

Although arrangement is made according to such a manner in FIG. 2, those skilled in the art can modify and substitute the arrangement manner as shown in FIG. 2. For example, in the first row, arrangement starts with a unit of other color, then subsequent sub pixel units can select other colors, as long as the RBG sub pixel units (other sub pixel unit of a color such as white (W) can also be used) in the array are uniformly, alternately and periodically arranged in the whole layout, so that any position in the array can display a desired color through these elementary sub pixel units. The so-called uniformization requirement means that numbers of each sub pixel units in the array are essentially the same, and the mutual positional relationship among adjacent sub pixel units in the whole array is also essentially the same. It is designed by taking the sub pixel units centering at coordinates (R1,L1), (R2,L3), (R4,L2) and (R5,L4) as one cycle, thus a uniform distribution can be implemented.

By adopting the arrangement of the sub pixel units as shown in FIG. 2, respective sub pixel units are more compact, and the pixel sharing effect among the sub pixel units is obviously improved, such that a virtual algorithm technology can be better implemented and the display device can output a high-quality picture.

While arranging the sub pixel unit array, an arrangement of the sub pixel units as shown in FIG. 3 can be adopted in another embodiment of the invention. That is, all sub pixel units in Row L(4i−3) have the same color, which is one of four colors of R, B, G and X; all sub pixel units in Row L(4i−2) have the same color, which is another one of four colors of R, B, G and X; all sub pixel units in Row L(4i−1) have the same color, which is one of four colors of R, B, G and X but different from the colors of the sub pixel units in Row L(4i−3) and Row L(4i−2); all sub pixel units in Row L(4i) have the same color, which is one of the four colors of R, B, G and X but different from the colors of the sub pixel units in Row L(4i−3), Row L(4i−2) and Row L(4i−1), where i is a natural number.

As shown in FIG. 3, the first row L1 is arranged with R, the second row L2 is arranged with B, the third row L3 is arranged with G, and the fourth row L4 is arranged with W. Then, arrangement is made according to a cycle, the rule of which is as follows: when i is assigned with different values, all sub pixel units in Row L(4i−3) have the same color, which is one of four colors of R, B, G and W; all sub pixel units in Row L(4i−2) have the same color, which is another color of the four colors of R, B, G and W; all sub pixel units in Row L(4i−1) have the same color, which is one of the four colors of R, B, G and W but different from the colors of the sub pixel units in Row L(4i−3) and Row L(4i−2); all sub pixel units in Row L(4i) have the same color, which is one of the four colors of R, B, G and W but different from the colors of the sub pixel units in Row L(4i−3), Row L(4i−2) and Row L(4i−1), where i is a natural number.

As shown in FIG. 3, Rows L1, L5 and L9 have the same color, which is red; Rows L2, L6 and L10 have the same color, which is blue; Rows L3, L7 and L11 have the same color, which is green; Rows L4, L8 and L12 have the same color, which is white; and so on. The first column R1 is arranged with RBGWRBGW; the second column R2 is arranged with GWRBGWRB; the third column R3 is arranged with RBGWRBGW; and subsequent arrangement is as shown in FIG. 3.

Similar to FIG. 2, those skilled in the art can modify and substitute the arrangement manner as shown in FIG. 3. For example, each row can be arranged by starting with units of other color, and the sub pixel units in each column can also be properly adjusted, as long as the RBG sub pixel units (other sub pixel unit of a color such as white (W) can also be used) in the array are uniformly, alternatively and periodically arranged in the whole layout, so that any position in the array can display a desired color through these elementary sub pixel units.

Figure 4:
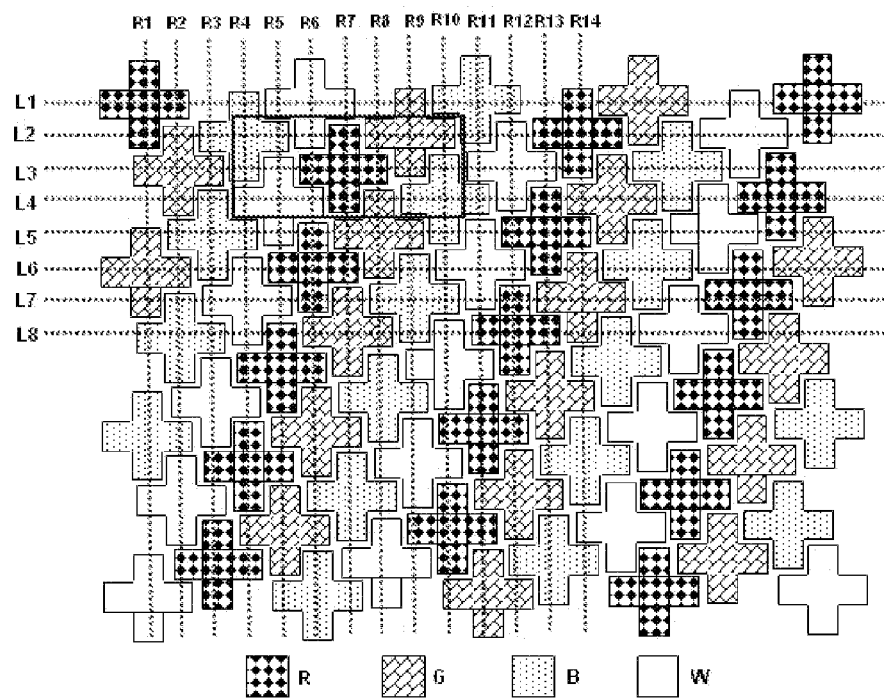
FIG. 4 is a schematic diagram of a sampling region of a sub pixel unit array according to one embodiment of the invention.
Figure 5:
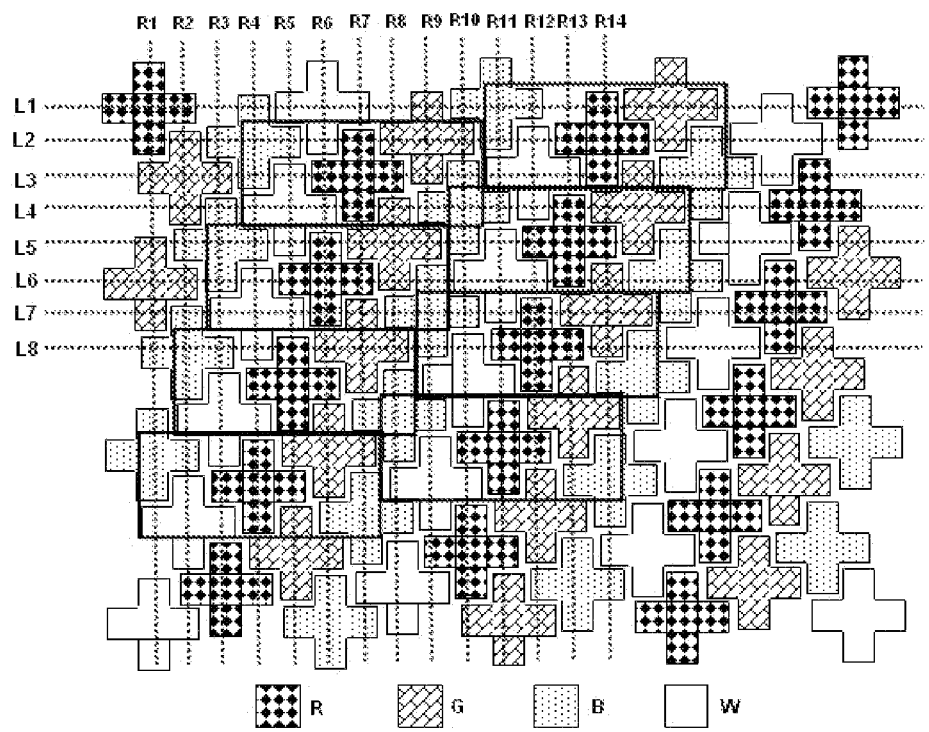
FIG. 5 is a schematic diagram of a sub pixel unit array periodically divided in a division manner as shown in FIG. 4 according to one embodiment of the invention.

After the sub pixel units are arranged, it is necessary to divide sampling regions in the sub pixel unit array. In one embodiment of the invention, for sub pixel units of each color in the sub pixel unit array, the sub pixel unit array has the sampling region of a corresponding color. For example, the sub pixel unit array is divided according to manners as shown in FIG. 4 and FIG. 5. In such division manners, the shape of the sampling region is a rectangle, which centers at the sub pixel unit of the corresponding color in the length direction. The length of the rectangle is 7/3 of a transverse length of each sub pixel unit, and the width of the rectangle is same as the longitudinal length of each sub pixel unit.

Long edges of the rectangle as shown in FIG. 4 and FIG. 5 may be parallel with the horizontal axis, or may be perpendicular to the horizontal axis. Taking a red sampling region as an example, each region centers at a red cross sub pixel unit. Lengths of each sub pixel unit in transverse and longitudinal directions are defined as 3W, and the length of the divided sampling region is 7W, and the width of the divided sampling region is the width of each sub pixel unit, i.e., 3W, as shown by the rectangle in FIG. 4. This region comprises red, green, blue and white sub pixel units. The red sub pixel unit is a center sub pixel unit, and the sub pixel units of the rest of the three colors are distributed around the center sub pixel unit. This region is a red sampling region and emits red light. Similarly, light emitted from the blue and green sampling regions are correspondingly blue and green.

By dividing the whole sub pixel unit array according to the division manner as shown in FIG. 4, a division diagram of a sub pixel unit array as shown in FIG. 5 can be obtained. It should be noted that such division manner of sampling regions does not uniformly divide the whole sampling plane. Different sampling regions are overlapped at rectangle corners, which results in superimposing information with regard to outputting information.

Figure 6:
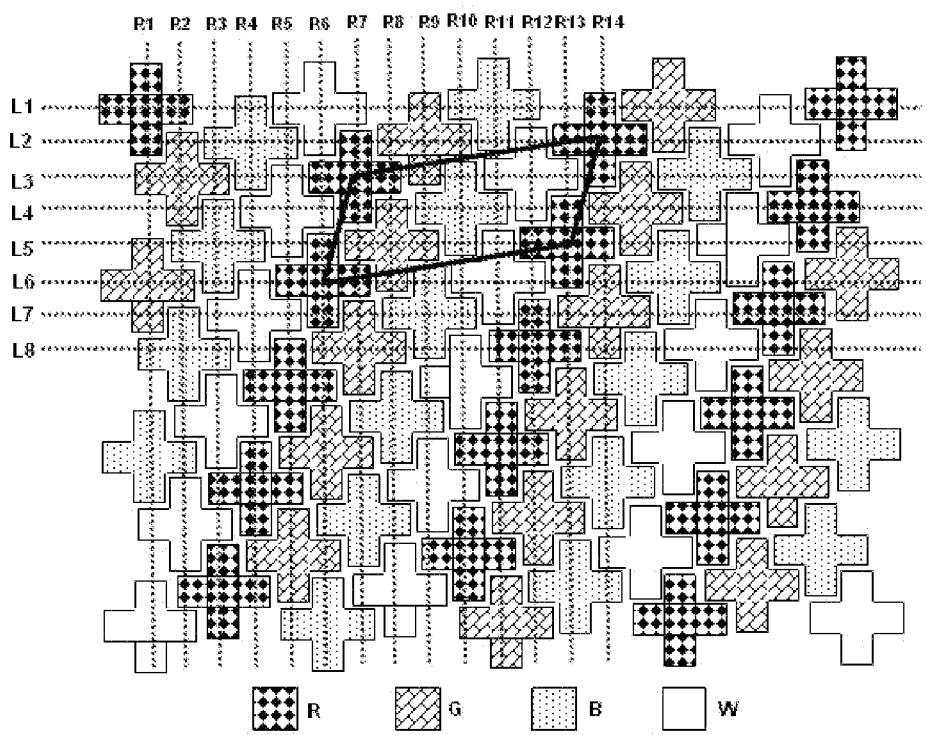
FIG. 6 is a schematic diagram of a sampling region of a sub pixel unit array according to another embodiment of the invention.
Figure 7:
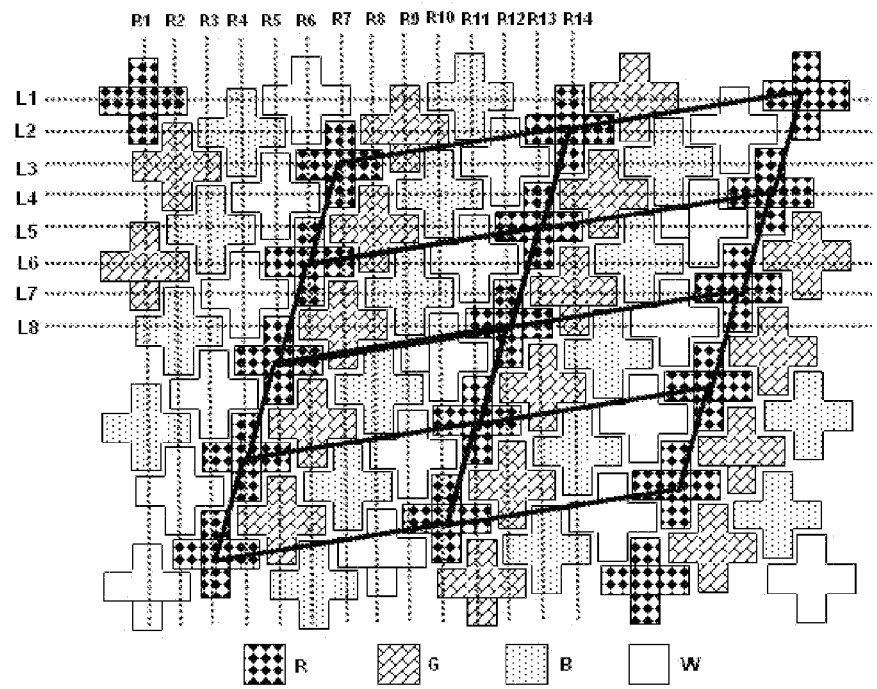
FIG. 7 is a schematic diagram of a sub pixel unit array periodically divided in a division manner as shown in FIG. 6 according to one embodiment of the invention.

To this end, in one embodiment of the invention, the shape of the sampling region is a parallelogram, of which vertexes are located at centers of four sub pixel units with same color at adjacent positions. For example, the sub pixel unit array is divided according to a manner as shown in FIG. 6. That is, the sub pixel unit array is divided by taking the parallelogram formed by the centers of four sub pixel units with the same color at adjacent positions as an elementary unit. In FIG. 6, a red sampling region is obtained by taking the centers of four adjacent red sub pixel units as four vertexes of a parallelogram. The pattern obtained after the whole sub pixel unit array is divided by taking such a parallelogram as a elementary unit is as shown in FIG. 7. It can be seen from the FIG. 7 that, the whole plane can be uniformly divided according to such manner, and different sampling regions do not overlap on respective corners of the parallelogram, thus avoiding the case of information superposition in FIG. 5.

Figure 8:
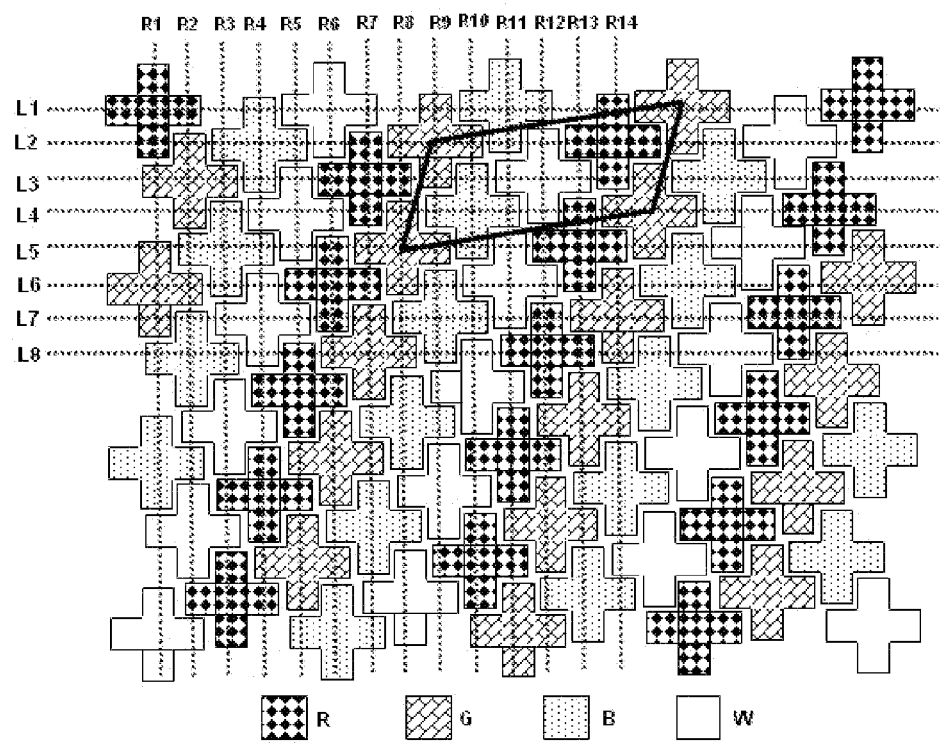
FIG. 8 is a schematic diagram of a green sampling region of a sub pixel unit array divided in a manner as shown in FIG. 6 according to one embodiment of the invention.
Figure 9:
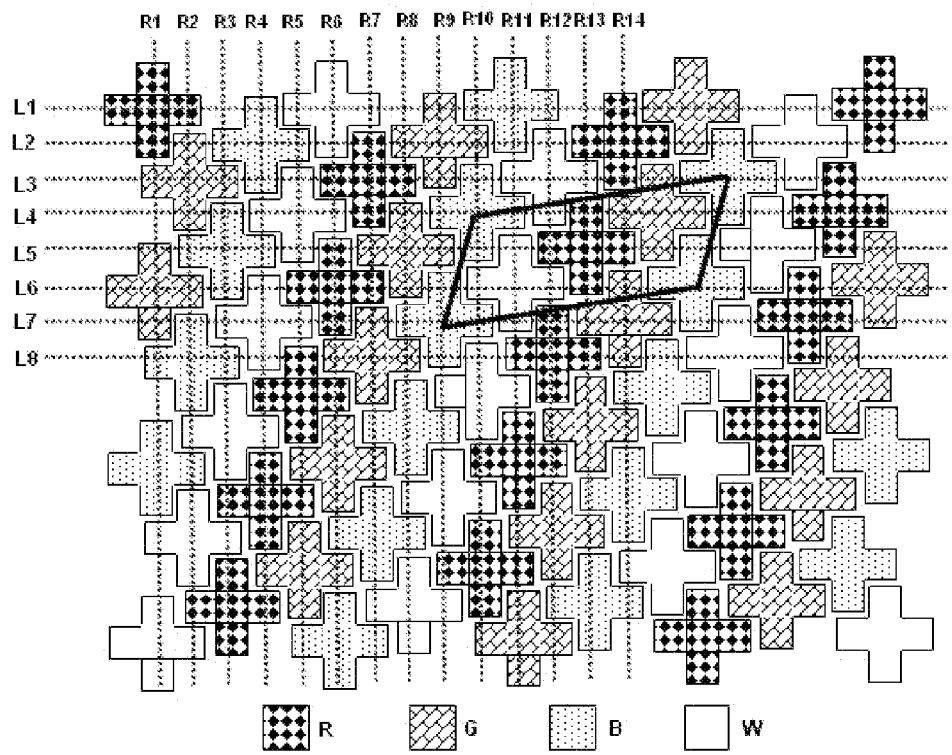
FIG. 9 is a schematic diagram of a blue sampling region of a sub pixel unit array divided in a manner as shown in FIG. 6 according to one embodiment of the invention.
Figure 10:
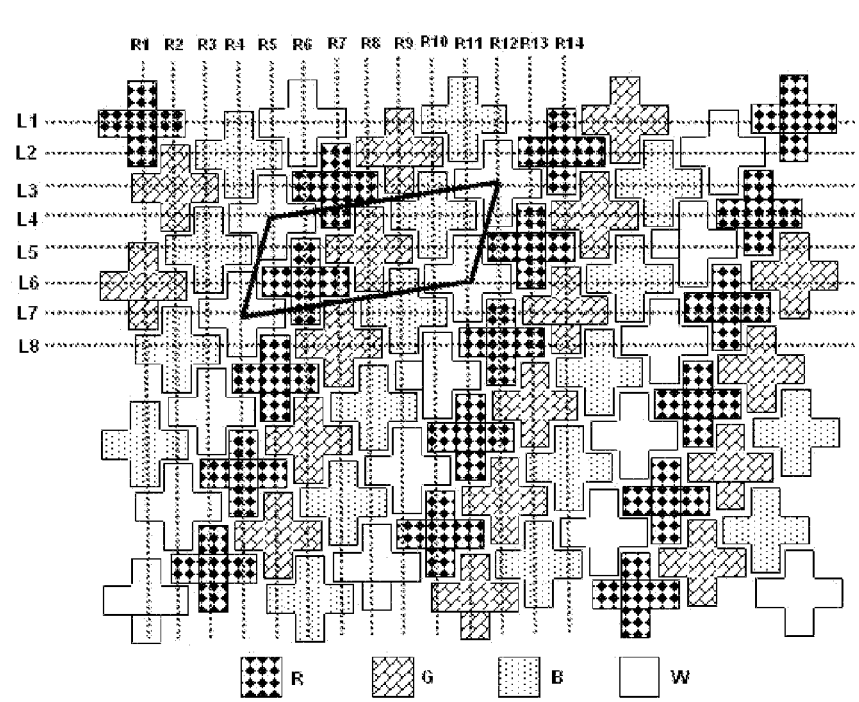
FIG. 10 is a schematic diagram of a white sampling region of a sub pixel unit array divided in a manner as shown in FIG. 6 according to one embodiment of the invention.

FIG. 8 is a schematic diagram of a green sampling region divided by taking the parallelogram in the above embodiment as an elementary unit. In FIG. 8, the green sampling region of a parallelogram is formed by taking centers of four adjacent green sub pixel units as four vertexes of the parallelogram. A blue sampling region and a white sampling region formed according to such a manner are as shown in FIG. 9 and FIG. 10.

Figure 11:
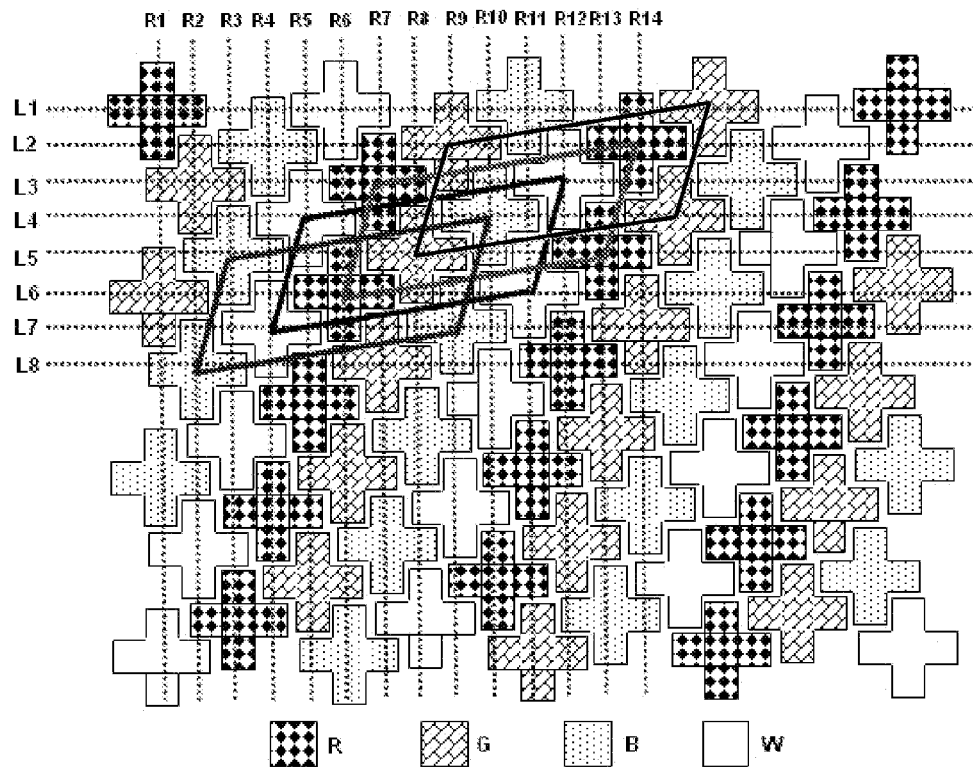
FIG. 11 is a schematic diagram of turning on sampling regions of different colors for light-emitting display according to an arrangement manner of one embodiment of the invention.

After being set, those sub pixel sampling regions can be used for light-emitting display. When an image signal is being output, the output of the sampling region of each color of RGBW is taken as a standard, since the four colors of red, green, blue and white have different sampling regions. As shown in FIG. 11, for example, when white is displayed, four parallelograms in the diagram respectively represent blue, white, red and green sampling regions, at the positions of a polygonal square formed by non-overlapped edges of the four sampling regions, the blue, red and green sampling regions are turned on, and thus white is displayed in this region. When brightness compensation is required at this position, the white sampling region is turned on to compensate brightness. In addition, according to needs of turning on different colors, the color displayed in this polygonal square is totally determined by different sampling regions of this position. At the position of the white sampling region, through color conversion design (for example, yellow can be displayed at this position), a gamut boundary is increased so as to increase gamut. In addition, the brightness of yellow is high, which can compensate insufficient brightness of the display panel. In terms of algorithm, a signal uniformization method is adopted, and grayscales of the colors can be averaged in the sampling regions to output a signal, so as to express a signal to be output.

Figure 12:
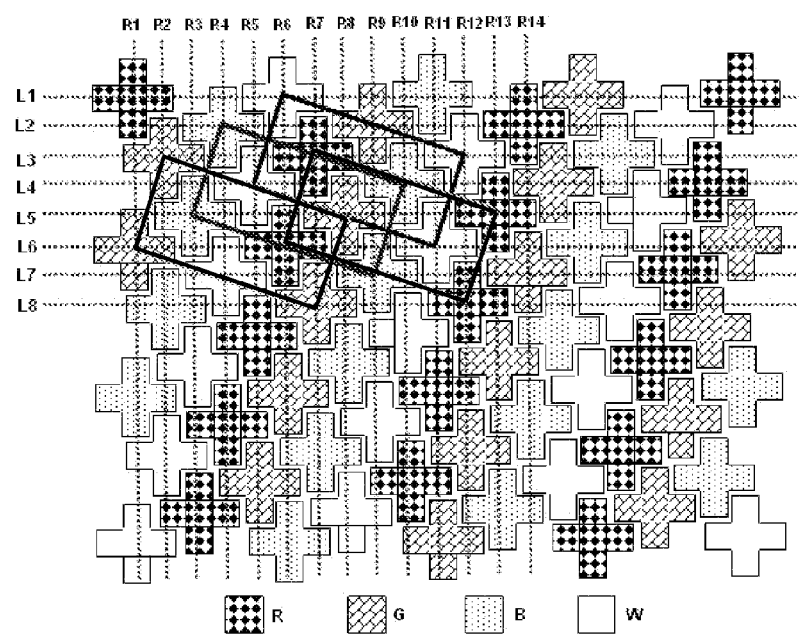
FIG. 12 is a schematic diagram of turning on sampling regions of different regions for light-emitting display according to an arrangement manner of another embodiment of the invention.

FIG. 12 is another arrangement manner of continuous sampling regions in another embodiment of the invention and shows a method for outputting white points by overlapping rectangle sampling regions of four colors RGBW. In the embodiment, sampling regions in rectangular shapes are obtained by taking a rectangle formed by centers of four adjacent sub pixel units of the same color as an elementary unit for division, and these rectangular sampling regions are adopted for light-emitting display. A method for outputting an image signal in the embodiment is similar to that of the embodiment in FIG. 11. When white is displayed, at the position of a polygonal square formed by non-overlapped edges of the sampling regions of four colors of RGBW, the blue, red and green sampling regions are turned on, and thus white is displayed in this region. When brightness compensation is required at this position, the white sampling region is turned on to compensate brightness. In addition, according to needs of starting different colors, the color displayed in this polygonal square is totally determined by different sampling regions of this position. At the position of the white sampling region, through color conversion design (for example, yellow can be displayed at this position), a gamut boundary is increased so as to increase gamut. In addition, the brightness of yellow is high, which can compensate insufficient brightness of the display panel. In terms of algorithm, a signal uniformization method is adopted, and grayscales of the colors can be averaged in the sampling regions to output a signal, so as to express a signal to be output.

Figure 13:
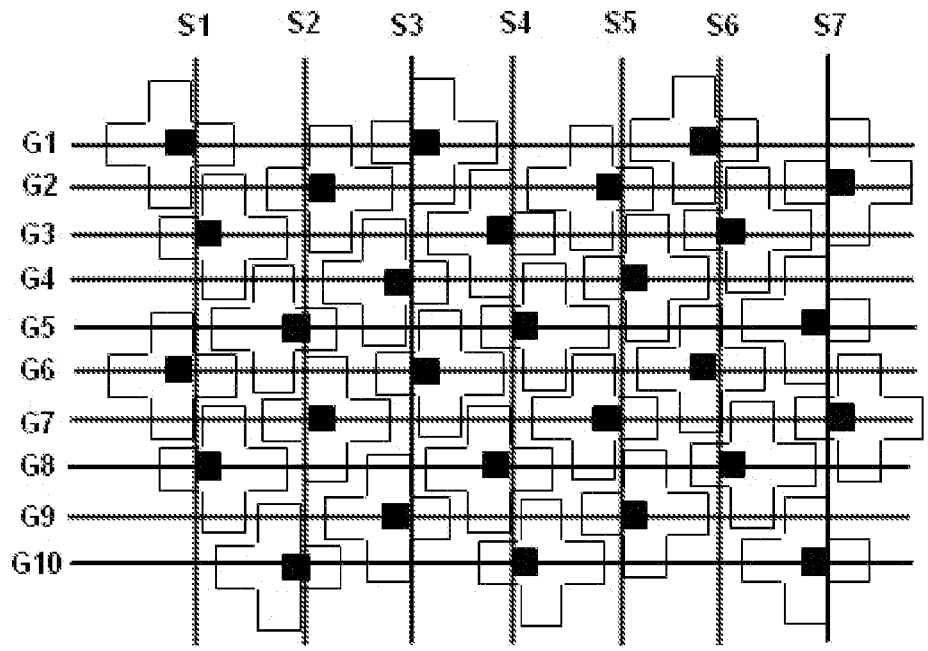
FIG. 13 is a diagram schematic of a driving circuit of a display panel according to one embodiment of the invention.

FIG. 13 is a driving circuit diagram of a sub pixel unit array according to one embodiment of the invention. G1-G10 represent gate electrode input, and S1-S7 represent source electrode input. Because of pattern arrangement, an S1 source electrode line drives sub pixel units at corresponding positions such as G1, G3, G6 and G8, an S2 source electrode line drives sub pixel units at corresponding positions such as G2, G5, G7 and G10. The circuit is obviously different from the driving circuit of the display panel as shown in FIG. 1.

Figure 14:
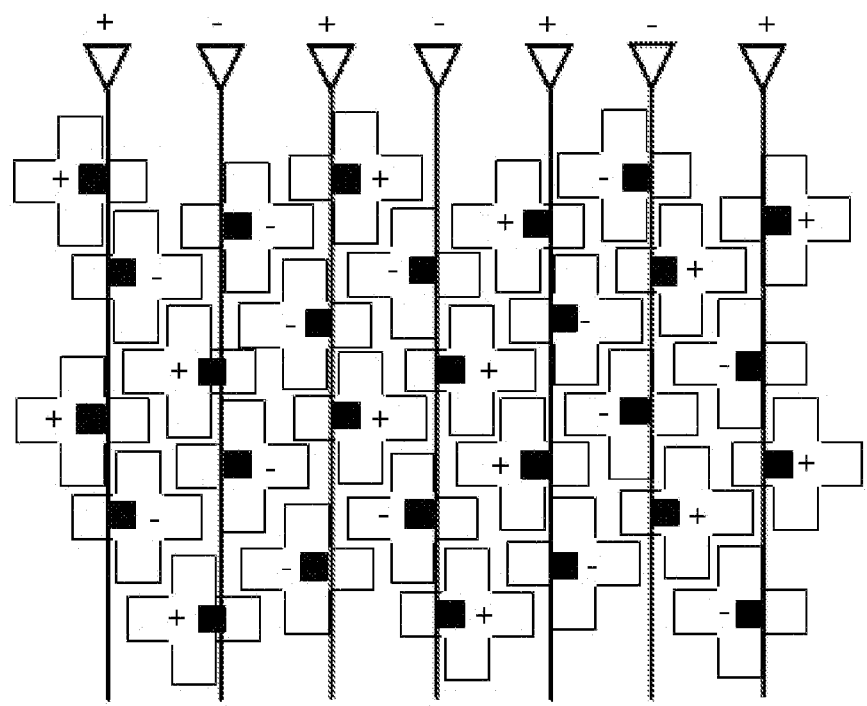
FIG. 14 is a diagram schematic of signal inversion in a driving circuit according to one embodiment of the invention.

FIG. 14 is a signal inversion design which adopts a point signal inversion design. The sub pixel unit at a position (S1,G1) is +, the sub pixel unit at a position (S1,G3) is −, the sub pixel unit at a position (S6,G1) is −, and the sub pixel unit at a position (S8,G3) is +. The sub pixel unit at a position (S2,G2) is −, the sub pixel unit at a position (S2,G5) is +, the sub pixel unit at a position (S2,G7) is −, and the sub pixel unit at a position (S2,G10) is +. The subsequent driving design is as shown in FIG. 14.

The display panel according to an embodiment of the invention is formed by the above sub pixel units and the sub pixel unit array. Meanwhile, an embodiment of the invention also seeks protection for a display method, which arranges the above-mentioned sub pixel units to form an array, and implements light-emitting display according to a desired light-emitting color by adopting sampling region division manners in above respective embodiments.

At least one embodiment of the invention provides a display method, comprising: forming sub pixel units of red (R), green (G), blue (B) and one other color (X). The sub pixel units are arranged into a sub pixel unit array, the sub pixel units in the sub pixel unit array are all in a cross shape, the cross shape being constructed with rectangles with an aspect ratio of 3:1 in transverse and longitudinal directions, and the cross shape having equal lengths in the transverse and longitudinal directions, and respective sub pixel units in the sub pixel unit array are interlaced with each other sequentially and arranged periodically.

In one embodiment, the display method further comprises: for sub pixel units of each color in the sub pixel unit array, dividing a sampling region of the color in the sub pixel unit array; selecting different combinations of sampling regions to be turned on according to colors to be displayed.

In one embodiment, the one other color (X) is white (W), yellow (Y) or cyan (C).

In one embodiment, a mutual positional relationship among the sub pixel units in the sub pixel array can be defined in such a manner as: a horizontal axis and a vertical axis being arranged in one plane, abscissa x=R(1), R(2), R(3) . . . R(m), which are arranged from left to right in sequence; ordinate y=L(1), L(2), L(3) . . . L(n), which are arranged from top to bottom in sequence; a distance between adjacent abscissas being equal to that between adjacent ordinates; and positions of the sub pixel units in the plane being respectively: for Row L(5*$i_1$+1), respective sub pixel units center at positions with abscissas being R(5$k_1$+1), where $k_1$ and $i_1$ are integers and are greater than or equal to 0; for Row $L(5*i_1+2)$, respective sub pixel units center at positions with abscissas being $R(5k_1+4)$, where $k_2$ and $i_2$ are integers and are greater than or equal to 0; for Row $L(5*i_1+3)$, respective sub pixel units center at positions with abscissas being $R(5k_1+2)$, where $k_3$ and $i_3$ are integers and are greater than or equal to 0; for Row $L(5*i_1+4)$, respective sub pixel units center at positions with abscissas being $R(5k_1+5)$, where $k_4$ and $i_4$ are integers and are greater than or equal to 0; and for Row $L(5*i_1+5)$, respective sub pixel units center at positions with abscissas being $R(5k_1+3)$, where $k_5$ and $i_5$ are integers and are greater than or equal to 0.

In one embodiment, an arrangement manner of the sub pixel units of the first row $y=L(1)$ is arranging from left to right sequentially according to a periodical cycle of RXB-GRXBG, an arrangement manner of the sub pixel units of the second row $y=L(2)$ is arranging from left to right sequentially according to a periodical cycle of BGRXB-GRX, an arrangement manner of the sub pixel units of the third row $y=L(3)$ is arranging from left to right sequentially according to a periodical cycle of GRXBGRXB, an arrangement manner of the sub pixel units of the fourth row $y=L(4)$ is arranging from left to right sequentially according to a periodical cycle of XBGRXBGR, an arrangement manner of the sub pixel units of the fifth row $y=L(5)$ is arranging from left to right sequentially according to a periodical cycle of BGRXBGRX. And the arrangement rule of other rows is that, if a sequence of Row $L(i)$ is ABCDABCD, an arrangement sequence of Row $L(i+5)$ is DABCDABC in sequence, where i is a natural number, and ABCD is one of RXBG, BGRX, GRXB and XBGR.

In one embodiment, all sub pixel units in Row $L(4i-3)$ have the same color, which is one of four colors of R, B, G and X; all sub pixel units in Row $L(4i-2)$ have the same color, which is another one of four colors of R, B, G and X; all sub pixel units in Row $L(4i-1)$ have the same color, which is one of four colors of R, B, G and X but different from the colors of the sub pixel units in Row $L(4i-3)$ and Row $L(4i-2)$; all sub pixel units in Row $L(4i)$ have the same color, which is one of the four colors of R, B, G and X but different from the colors of the sub pixel units in Row $L(4i-3)$, Row $L(4i-2)$ and Row $L(4i-1)$, where i is a natural number.

In one embodiment, the shape of the sampling region is a rectangle, which centers at the sub pixel unit of the corresponding color in the length direction. The length of the rectangle is 7/3 of a transverse length of each sub pixel unit, and the width of the rectangle is same as the longitudinal length of each sub pixel unit.

In one embodiment, a shape of the sampling region is a parallelogram, and vertexes of the parallelogram are located at centers of four sub pixel units of same color at adjacent positions.

The implementation of the display method can refer to the above embodiments of the display panel, which shall not be repeated here.

Those skilled in the art can apply the display panel and the display method to a display device. Therefore, at least one embodiment of the invention further provides a display device, comprising the display panel. The display panel can be any product or means having a display function, such as an OLED panel, a mobile phone, a tablet computer, a television, a monitor, a laptop, a digital photo frame and a navigator.

In the display panel, the display method and the display device according to the embodiments of the invention, the arrangement of the display panel is more compact, so as to increase brightness output area obviously, and display effect at the periphery of the display panel is also obviously improved.

The above embodiments are merely exemplary embodiments of the invention, and not intended to define the scope of the invention. Although the present invention is described in detail with reference to the embodiments, those skilled in the art should understand that various combinations, modifications and equivalent substitutions for the technical solution of the invention should not depart from the spirit and scope of the technical solution of the invention, and are covered within the scope of the claims of the invention.

The application claims priority of Chinese Patent Application No. 201410294186.6 filed on Jun. 26, 2014, the disclosure of which is incorporated herein by reference in its entirety as part of the present application.

What is claimed is:

1. A display panel, comprising: sub pixel units of red (R), green (G), blue (B) and one other color (X), wherein:
   the sub pixel units are arranged into a sub pixel unit array; the sub pixel units in the sub pixel unit array are all in a cross shape, the cross shape being constructed with rectangles with an aspect ratio of 3:1 in transverse and longitudinal directions, and the cross shape having equal lengths in the transverse and longitudinal directions; and respective sub pixel units in the sub pixel unit array are interlaced with each other sequentially and arranged periodically; and
   a row pitch and a column pitch of the sub pixel units are equal, a center pitch of two adjacent sub pixel units in a same row is 5 times of the column pitch, and a center pitch of two adjacent sub pixel units in a same column is 5 times of the row pitch.

2. The display panel according to claim 1, wherein, the one other color (X) is white (W), yellow (Y) or cyan (C).

3. The display panel according to claim 1, wherein, a mutual positional relationship among the sub pixel units in the sub pixel array is defined in such a manner as:
   a horizontal axis and a vertical axis are arranged in one plane, abscissa $x=R(1), R(2), R(3) \ldots R(m)$, which are arranged from left to right in sequence; ordinate $y=L(1), L(2), L(3) \ldots L(n)$, which are arranged from top to bottom in sequence; a distance between adjacent abscissas is equal to that between adjacent ordinates; and positions of the sub pixel units in the plane are respectively:
   for Row $L(5*i_1+1)$, respective sub pixel units center at positions with abscissas being $R(5k_1+1)$, where $k_1$ and $i_1$ are integers and are greater than or equal to 0;
   for Row $L(5*i_1+2)$, respective sub pixel units center at positions with abscissas being $R(5k_1+4)$, where $k_2$ and $i_2$ are integers and are greater than or equal to 0;
   for Row $L(5*i_1+3)$, respective sub pixel units center at positions with abscissas being $R(5k_1+2)$, where $k_3$ and $i_3$ are integers and are greater than or equal to 0;
   for Row $L(5*i_1+4)$, respective sub pixel units center at positions with abscissas being $R(5k_1+5)$, where $k_4$ and $i_4$ are integers and are greater than or equal to 0; and
   for Row $L(5*i_1+5)$, respective sub pixel units center at positions with abscissas being $R(5k_1+3)$, where $k_5$ and $i_5$ are integers and are greater than or equal to 0.

4. The display panel according to claim 3, wherein,
   an arrangement manner of sub pixel units in a first row $y=L(1)$ involves arranging from left to right according to a periodical cycle of RXBGRXBG in sequence, an arrangement manner of sub pixel units in a second row y=L(2) involves arranging from left to right according to a periodical cycle of BGRXBGRX in sequence, an arrangement manner of sub pixel units in a third row y=L(3) involves arranging from left to right according to a periodical cycle of GRXBGRXB in sequence, an arrangement manner of sub pixel units in a fourth row y=L(4) involves arranging from left to right according to a periodical cycle of XBGRXBGR in sequence, an arrangement manner of sub pixel units in a fifth row y=L(5) involves arranging from left to right according to a periodical cycle of BGRXBGRX in sequence, and an arrangement rule of other rows is that, if a sequence of Row L(i) is ABCDABCD, an arrangement sequence of Row L(i+5) is DABCDABC in sequence, where i is a natural number, and ABCD is one of RXBG, BGRX, GRXB and XBGR.

5. The display panel according to claim 3, wherein,
all sub pixel units in Row L(4i−3) have the same color, which is one of four colors of R, B, G and X;
all sub pixel units in Row L(4i−2) have the same color, which is another one of four colors of R, B, G and X;
all sub pixel units in Row L(4i−1) have the same color, which is one of four colors of R, B, G and X but different from the colors of the sub pixel units in Row L(4i−3) and Row L(4i−2); and
all sub pixel units in Row L(4i) have the same color, which is one of the four colors of R, B, G and X but different from the colors of the sub pixel units in Row L(4i−3), Row L(4i−2) and Row L(4i−1), where i is a natural number.

6. The display panel according to claim 1, wherein, for sub pixel units of each color in the sub pixel unit array, a sampling region of a corresponding color is arranged in the sub pixel unit array.

7. The display panel according to claim 6, wherein, a shape of the sampling region is a rectangle, the rectangle centers at a sub pixel unit with the corresponding color in a length direction, a length of the rectangle is 7/3 of a transverse length of each sub pixel unit, a width of the rectangle is same as a longitudinal length of each sub pixel unit, and long edges of the rectangle are parallel with or vertical to the horizontal axis.

8. The display panel according to claim 6, wherein, a shape of the sampling region is a parallelogram, and vertexes of the parallelogram are located at centers of the four sub pixel units of same color at adjacent positions.

9. A display device, comprising the display panel according to claim 1.

10. A display method of a display panel, comprising:
forming sub pixel units of red (R), green (G), blue (B) and one other color (X), wherein the sub pixel units are arranged into a sub pixel unit array;
wherein the sub pixel units in the sub pixel unit array are all in a cross shape, wherein the cross shape is constructed with rectangles with an aspect ratio of 3:1 in transverse and longitudinal directions, the cross shape has equal lengths in the transverse and longitudinal directions, and respective sub pixel units in the sub pixel unit array are interlaced with each other sequentially and arranged periodically; and
wherein a row pitch and a column pitch of the sub pixel units are equal, a center pitch of two adjacent sub pixel units in a same row is 5 times of the column pitch, and a center pitch of two adjacent sub pixel units in a same column is 5 times of the row pitch.

11. The display method according to claim 10, further comprising:
for sub pixel units of each color in the sub pixel unit array, dividing a sampling region of the color in the sub pixel unit array; and
selecting different combinations of sampling regions to be turned on according to colors to be displayed.

12. The display method according to claim 11, wherein, the one other color (X) is white (W), yellow (Y) or cyan (C).

13. The display method according to claim 11, wherein, a mutual positional relationship among the sub pixel units in the sub pixel array can be defined in such a manner as:
a horizontal axis and a vertical axis are arranged in a plane, abscissa x=R(1), R(2), R(3) . . . R(m), which are arranged from left to right in sequence; ordinate y=L(1), L(2), L(3) . . . L(n), which are arranged from top to bottom in sequence; a distance between adjacent abscissas is equal to that between adjacent ordinates; and positions of the sub pixel units in the plane are respectively:
for Row $L(5*i_1+1)$, respective sub pixel units center at positions with abscissas being $R(5k_1+1)$, where $k_1$ and $i_1$ are integers and are greater than or equal to 0;
for Row $L(5*i_1+2)$, respective sub pixel units center at positions with abscissas being $R(5k_1+4)$, where $k_2$ and $i_2$ are integers and are greater than or equal to 0;
for Row $L(5*i_1+3)$, respective sub pixel units center at positions with abscissas being $R(5k_1+2)$, where $k_3$ and $i_3$ are integers and are greater than or equal to 0;
for Row $L(5*i_1+4)$, respective sub pixel units center at positions with abscissas being $R(5k_1+5)$, where $k_4$ and $i_4$ are integers and are greater than or equal to 0; and
for Row $L(5*i_1+5)$, respective sub pixel units center at positions with abscissas being $R(5k_1+3)$, where $k_5$ and $i_5$ are integers and are greater than or equal to 0.

14. The display method according to claim 13, wherein,
an arrangement manner of sub pixel units in a first row y=L(1) involves arranging from left to right according to a periodical cycle of RXBGRXBG in sequence,
an arrangement manner of sub pixel units in a second row y=L(2) involves arranging from left to right according to a periodical cycle of BGRXBGRX in sequence,
an arrangement manner of sub pixel units in a third row y=L(3) involves arranging from left to right according to a periodical cycle of GRXBGRXB in sequence,
an arrangement manner of sub pixel units in a fourth row y=L(4) involves arranging from left to right according to a periodical cycle of XBGRXBGR in sequence,
an arrangement manner of sub pixel units in a fifth row y=L(5) involves arranging from left to right according to a periodical cycle of BGRXBGRX in sequence, and
an arrangement rule of other rows is that if a sequence of Row L(i) is ABCDABCD, an arrangement sequence of Row L(i+5) is DABCDABC in sequence, where i is a natural number, and ABCD is one of RXBG, BGRX, GRXB and XBGR.

15. The display method according to claim 13, wherein,
all sub pixel units in Row L(4i−3) have the same color, which is one of four colors of R, B, G and X;
all sub pixel units in Row L(4i−2) have the same color, which is another one of four colors of R, B, G and X;
all sub pixel units in Row L(4i−1) have the same color, which is one of four colors of R, B, G and X but different from the colors of the sub pixel units in Row L(4i−3) and Row L(4i−2); and
all sub pixel units in Row L(4i) have the same color, which is one of the four colors of R, B, G and X but different from the colors of the sub pixel units in Row L(4i−3), Row L(4i−2) and Row L(4i−1), where i is a natural number.

16. The display method according to claim 11, wherein, a shape of the sampling region is a rectangle, the rectangle centers at a sub pixel unit with the corresponding color in a length direction, a length of the rectangle is 7/3 of a transverse length of each sub pixel unit, a width of the rectangle is same as a longitudinal length of each sub pixel unit, and long edges of the rectangle are parallel with or perpendicular to the horizontal axis.

17. The display method according to claim 11, wherein, a shape of the sampling region is a parallelogram, and vertexes of the parallelogram are located at centers of four sub pixel units of same color at adjacent positions.

18. The display panel according to claim 3, wherein, for sub pixel units of each color in the sub pixel unit array, a sampling region of a corresponding color is arranged in the sub pixel unit array.

19. The display panel according to claim 18, wherein, a shape of the sampling region is a rectangle, the rectangle centers at a sub pixel unit with the corresponding color in a length direction, a length of the rectangle is 7/3 of a transverse length of each sub pixel unit, a width of the rectangle is same as a longitudinal length of each sub pixel unit, and long edges of the rectangle are parallel with or vertical to the horizontal axis.

20. A display panel, comprising: sub pixel units of red (R), green (G), blue (B) and one other color (X), wherein:
   the sub pixel units are arranged into a sub pixel unit array;
      the sub pixel units in the sub pixel unit array are all in a cross shape, the cross shape being constructed with rectangles with an aspect ratio of 3:1 in transverse and longitudinal directions, and the cross shape having equal lengths in the transverse and longitudinal directions; and respective sub pixel units in the sub pixel unit array are interlaced with each other sequentially and arranged periodically; and
   a mutual positional relationship among the sub pixel units in the sub pixel array is defined in such a manner as:
      a horizontal axis and a vertical axis are arranged in one plane, abscissa x=R(1), R(2), R(3) . . . R(m), which are arranged from left to right in sequence; ordinate y=L(1), L(2), L(3) . . . L(n), which are arranged from top to bottom in sequence; a distance between adjacent abscissas is equal to that between adjacent ordinates; and positions of the sub pixel units in the plane are respectively:
      for Row $L(5*i_1+1)$, respective sub pixel units center at positions with abscissas being $R(5k_1+1)$, where $k_1$ and $i_1$ are integers and are greater than or equal to 0;
      for Row $L(5*i_1+2)$, respective sub pixel units center at positions with abscissas being $R(5k_1+4)$, where $k_2$ and $i_2$ are integers and are greater than or equal to 0;
      for Row $L(5*i_1+3)$, respective sub pixel units center at positions with abscissas being $R(5k_1+2)$, where $k_3$ and $i_3$ are integers and are greater than or equal to 0;
      for Row $L(5*i_1+4)$, respective sub pixel units center at positions with abscissas being $R(5k_1+5)$, where $k_4$ and $i_4$ are integers and are greater than or equal to 0; and
      for Row $L(5*i_1+5)$, respective sub pixel units center at positions with abscissas being $R(5k_1+3)$, where $k_5$ and $i_5$ are integers and are greater than or equal to 0.

* * * * *